United States Patent [19]
Hashimoto et al.

[11] Patent Number: 5,779,925
[45] Date of Patent: Jul. 14, 1998

[54] PLASMA PROCESSING WITH LESS DAMAGE

[75] Inventors: Koichi Hashimoto; Takeshi Kamata; Yukinobu Hikosaka; Akihiro Hasegawa, all of Kawasaki, Japan

[73] Assignee: Fujitsu Limited, Kawasaki, Japan

[21] Appl. No.: 542,622

[22] Filed: Oct. 13, 1995

[30] Foreign Application Priority Data

Oct. 14, 1994 [JP] Japan ................................ 6-249836
Jul. 19, 1995 [JP] Japan ................................ 7-183065

[51] Int. Cl.⁶ .................................................. H01L 21/02
[52] U.S. Cl. .................... 216/67; 156/625.1; 156/643.1; 156/646.1; 156/659.1; 216/41; 216/68; 216/70; 427/569; 427/571; 427/575; 438/710; 438/723; 438/758
[58] Field of Search .................. 156/625.1, 643.1, 156/646.1, 659.1; 216/67, 68, 70, 41; 427/569–571, 575; 437/235, 245, 228 PE; 438/710, 719, 720, 723, 758

[56] References Cited

U.S. PATENT DOCUMENTS 5,102,687  4/1992  Pelletter et al. ......................... 216/67
5,474,648  12/1995  Patrick et al. ......................... 216/67

OTHER PUBLICATIONS

Samukawa, J. Vac. Sci. Technol., B9, 3(1991) month unavailable, pp. 1471–1477, "400khz RF Biased ECR Plasma Etching for Al–Si–Cu Patterning".

Samukawa, JPN. J. Appl. Phys., 30, 11B, (1991) month unavailable, pp. 3154–3158, "400khz Radio–Frequency Biased Electron Cyclotron Resonance Position Etching".

Wolf, "Silicon Processing for the VSLI ERA", vol. II, 1992 month unavailable, pp. 53, 237, 238.

*Primary Examiner*—T. Tung
*Attorney, Agent, or Firm*—Armstrong, Westerman Hattori, McLeland & Naughton

[57] ABSTRACT

A method of manufacturing a semiconductor device including the steps of: (a) transporting a semiconductor wafer into a plasma process system, the semiconductor wafer having a semiconductor layer, a field insulating film and a gate insulating film formed on the semiconductor layer, said gate insulating film having a breakdown voltage of B (V) and a thickness of 10 nm or thinner, a conductive layer of a structured antenna formed on the gate insulating film and the field insulating film, the conductive layer having an antenna ratio of 500 or higher, and an insulating material pattern formed on the conductive layer, the insulating material pattern having an opening with an aspect ratio larger than 1; and (b) processing the semiconductor wafer in plasma having an electron temperature of Te (eV) equal to or less than B. With this method, it is possible to prevent damages to a gate insulating film even during a fine pattern process.

20 Claims, 12 Drawing Sheets

CONTINUOUS POWER SOURCE

ASYNCHRONOUS RF BIAS

INTERMITTENT POWER SOURCE

ELECTRON TEMPERATURE

SYNCHRONOUS RF BIAS

ELECTRON CURRENT

POWER SOURCE
(ON/OFF MODULATION)

SYNCHRONOUS
RF BIAS

PHASE θ

0°

90°

180°

270°

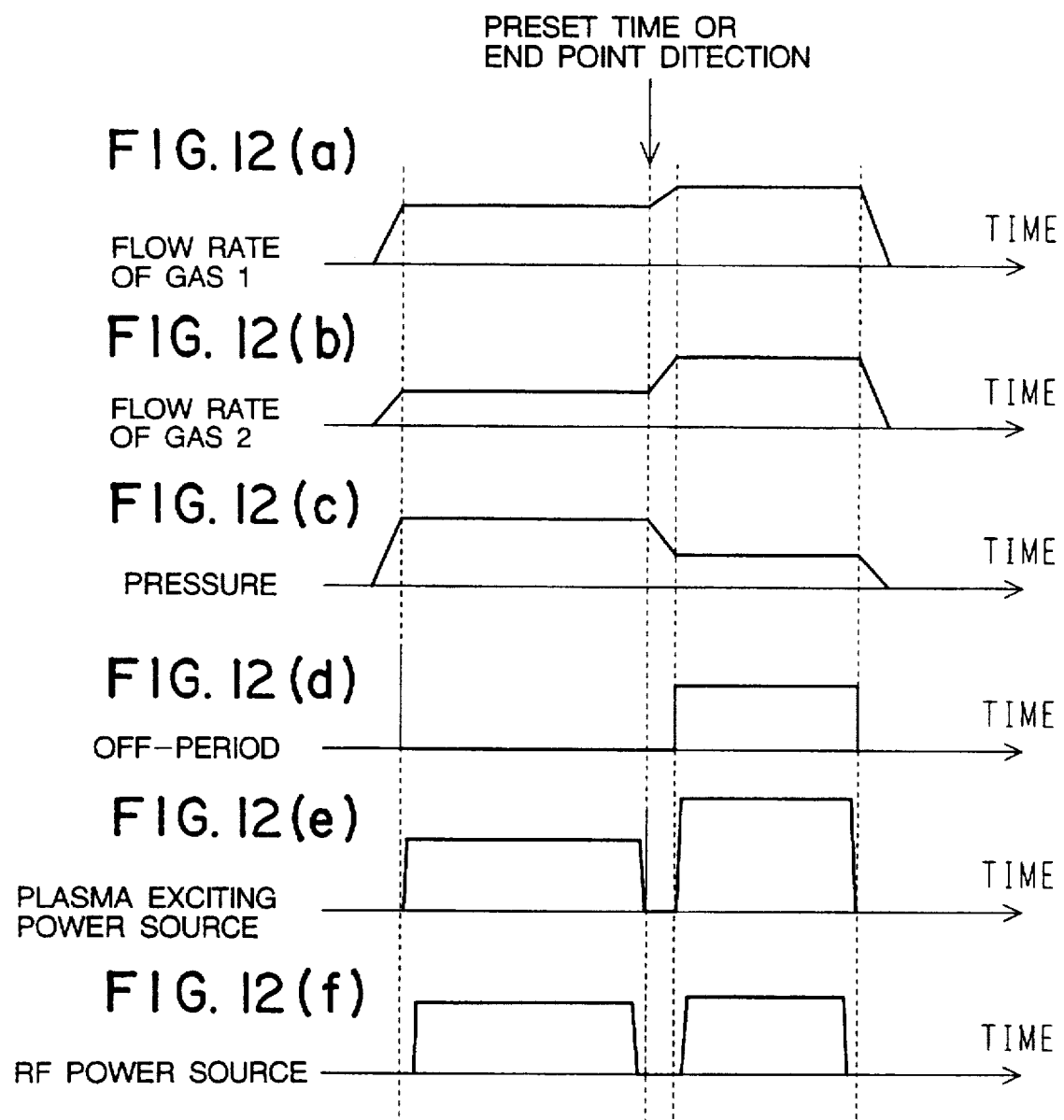

PLASMA PROCESSING WITH LESS DAMAGE

BACKGROUND OF THE INVENTION a) Field of the Invention

The present invention relates to manufacture technology of semiconductor devices, and more particularly to the manufacture technology of insulating gate field effect transistors (IGFET) using plasma.

b) Description of the Related Art

Recent advances in integration of large scale integrated (LSI) circuits are making patterns still finer. In order to transfer a fine mask pattern with fidelity onto a conductive layer or an insulating layer, anisotropic dry etching using plasma is widely used, such as reactive ion etching (RIE) and-electron cyclotron resonance (ECR) etching.

As the size of a semiconductor element becomes fine, the thickness of a gate insulating film of an IGFET is made thinner, and a thickness of 10 nm or thinner is now practically used. A thin gate insulating film is likely to be damaged by even a small electric stress.

For example, electric charges such as ions and electrons are incident upon a substrate during a plasma process. If there is a difference between incident positive and negative charges, a conductive layer formed over the gate insulating film and electrically isolated from the substrate is charged up. A potential difference between the conductive layer and the substrate may cause tunneling current to flow through the gate insulating film. This tunneling current may change the dielectric property of the gate insulating film and may cause dielectric breakdown thereof at the worst.

The plasma process, which may charge up a conductive layer disposed on a gate insulating film and/or a conductive layer connected to the gate electrode (hereinafter called a gate wiring), may damage the gate insulating film. For example, such plasma processes include patterning a gate wiring layer, forming a contact hole through an insulating layer to a gate wiring layer, cleaning the inner wall of a contact hole extending to the gate wiring layer by sputter etching, and plasma chemical vapor deposition (CVD) on the surface partially exposing a gate wiring layer.

Damages of a gate insulating film may lower not only a yield of semiconductor devices because of possible dielectric breakdown or change in the dielectric property of a gate insulating film, but also reliability of a gate insulating film or even of a semiconductor device. It is therefore desired to reliably prevent a plasma process from damaging a gate insulating film.

If plasma is not uniform on a semiconductor substrate, there is a difference between ion current and electron current incident upon the semiconductor substrate. Tunneling current caused by this difference may flow through a gate insulating film. A ratio (hereinafter called an antenna ratio) of a bottom area of a gate wiring to an active area of a gate insulating film is as large as about 10,000 in some semiconductor devices. During a plasma process of a gate wiring having such a high antenna ratio, even small unevenness of plasma may flow a large amount of tunneling current through the gate insulating film.

It has been tried therefore to make plasma for a plasma process as uniform as possible. Specifically, it has been proposed to make a plasma potential uniform and make a substrate bias potential uniform. For example, it has been proposed to pass magnetic fluxes in parallel to all the surface areas of a semiconductor substrate.

A conductive layer which is formed on a thick insulating film and connected to an electrode formed on a thin insulating film such as a gate insulating film, electrically isolated from the substrate, and has a broader area than the electrode is hereinafter called an antenna. A ratio is hereinafter called an antenna ratio, which ratio is a ratio of a bottom area of the conductive layer formed on the thick insulating film to an area of the electrode formed on the thin active (gate) insulating film.

Uniformity of plasma has been measured generally in terms of a dielectric breakdown percentage of gate insulating films having a gate wiring of a high antenna ratio thereon. For example, if a gate wiring having an exposed surface (surface exposed gate wiring) and an antenna ratio of 1,000,000 is not dielectrically broken down during a plasma process, the plasma is judged to be uniform.

Even if such a plasma that is proved to be sufficiently uniform by such measurement is used, it has been found recently that some gate insulating films are dielectrically broken down depending upon the pattern to be processed. For example, in patterning a gate wiring layer, a photoresist mask pattern is formed on the gate wiring layer. A ratio (hereinafter called an aspect ratio) of a thickness of photoresist to an opening width of a photoresist opening is now usually larger than 1. When a conductive layer under an insulating film pattern having a high aspect ratio is processed by using uniform plasma, a gate insulating film may be broken down. A structure of an antenna having an insulating film pattern having such a high aspect ratio is hereinafter called a structured antenna.

For example, a gate insulating film may be broken down if a structured antenna having an antenna ratio of 10,000 is exposed to ECR plasma which was proved uniform relative to a surface exposed antenna structure having an antenna ratio of 1,000,000.

Therefore, a gate insulating film may be broken down during manufacture processes of a semiconductor device having fine patterns, even if plasma which is uniform relative to a conductive layer having a continuous flat surface, is used.

SUMMARY OF THE INVENTION

It is an object of the present invention to provide a method of manufacturing a semiconductor device capable of preventing a gate insulating film from being dielectrically broken down even during a process of forming a fine pattern.

It is another object of the present invention to provide a semiconductor manufacturing apparatus capable of manufacturing a semiconductor device with fine patterns while preventing a dielectric breakdown of a gate insulating film.

According to one aspect of the present invention, a method of manufacturing a semiconductor device with use of plasma wherein at least one selected from the group consisting of rf frequency, power, magnetic field, pressure, and gas species is so selected that electron energy distribution in a plasma becomes smaller than a predetermined value, thereby allowing electrons to enter a conductive pattern appearing between insulating patterns of high aspect ratio.

According to another aspect of the present invention, there is provided a method of manufacturing a semiconductor device, comprising the steps of: (a) transporting a semiconductor wafer into a plasma process system, the semiconductor wafer comprising a semiconductor layer, a field insulating film and a gate insulating film formed on the semiconductor layer, the gate insulating film having a breakdown voltage of B (V) and a thickness of 10 nm or thinner, a conductive layer of a structured antenna formed on the gate insulating film and the field insulating film, the conductive layer having an antenna ratio of 500 or higher, and an insulating material pattern formed on the conductive layer, the insulating material pattern having an opening with an aspect ratio larger than 1; and (b) processing the semiconductor wafer in plasma having an electron temperature of Te (eV) equal to or larger than B.

According to the experiments made by the present inventor, a gate insulating film was broken down if an electron temperature of a plasma is higher than a breakdown voltage of the gate insulating film, and was not broken down if it is lower than the breakdown voltage.

According to another aspect of the present invention, there is provided a method of manufacturing a semiconductor device comprising the steps of: placing a substrate in a reaction chamber, the substrate having a field insulating film, a gate insulating film and a gate wiring formed thereon; supplying a periodically changing energy and exciting plasma over the substrate; and applying a bias to the substrate synchronously with the plasma excitation, a potential of the, substrate becoming substantially maximum at a timing when an electron temperature of the plasma becomes substantially minimum.

According to a further aspect of the present invention, there is provided a method of manufacturing a semiconductor device comprising the steps of: loading a semiconductor substrate in a reaction chamber, the semiconductor substrate having a field insulating film, a gate insulating film and a gate wiring formed thereon; repeating a supply and a suspension of a plasma exciting main energy over the semiconductor substrate during a first period; and applying a bias potential to the semiconductor substrate synchronously with a transition timing from the suspension to the supply of the plasma exciting main energy, electrons flowing into the semiconductor substrate at the transition timing.

According to the experiments made by the present inventor, if plasma exciting energy is supplied periodically and intermittently and the substrate bias is adjusted so that it takes a highest potential synchronously with the end of an energy supply suspension period, damages to the gate insulating film were reduced remarkably as compared to when the plasma exciting energy is supplied continuously or when the substrate bias is made asynchronous while supplying the plasma exciting energy intermittently.

According to another aspect of the present invention, there is provided an apparatus for manufacturing a semiconductor device comprising: a hermetic vessel, means for introducing gas into said vessel, under control, means for evacuating gas introduced into said hermetic chamber, under control, means for holding a substrate to be processed in said hermetic chamber, potential controller capable of affording a first time change to potential of said substrate, energy applying means for applying energy to gas in said hermetic chamber to produce plasma, capable of affording a second time change to the energy applied to the gas, means for synchronizing said first and second time change, capable of controlling phase relation between said first and second time change.

Thus, in a plasma process for a dense and fine pattern, it is possible to prevent damages to a gate insulating film which may otherwise be caused by plasma.

BRIEF DESCRIPTION OF THE DRAWINGS

FIG. 12 is a sequential diagram illustrating a plasma process using the system of FIG. 11 according to another embodiment of the invention.

DETAILED DESCRIPTION OF THE PREFERRED EMBODIMENTS

The inventor and his colleagues reported that a structured antenna having a high antenna ratio appeared due to the microloading effect while a gate wiring layer was etched, in U.S. Ser. No. 08/275,426 filed on Jul. 15, 1994 which is incorporated herein by reference. In etching a gate wiring layer deposited under a resist pattern, the structured antenna does not appear at the initial stage of etching because the gate wiring layer is electrically connected to the substrate at the initial stage. However, because of the microloading effect, etching is not still completed at the region with a narrow opening width even if etching at the region with a broad opening width is completed. At this second stage, the gate wiring layer is cut off at the region with the broad opening width. Therefore, a structured antenna having a high antenna ratio appears at this transient stage.

As an RF bias is applied to a substrate and an electric field is generated for attracting ions in plasma to the substrate, ions are accelerated toward the substrate. However, electrons in the plasma are decelerated toward the substrate. The force generated by this electric field is perpendicular to the surface of the substrate, and electrons are not decelerated in the direction in parallel to the substrate surface.

Therefore, most of electrons having various directions of motion as reflected by a random motion of electrons in the plasma are considered to be obliquely incident upon the substrate. As a result, a number of electrons collide with the upper side wall of an insulating pattern film on the structured antenna, whereas ions collide hardly. Negative charges are therefore accumulated on the upper side wall of the insulating pattern film.

It is considered that as an electric field generated by these negative charges becomes strong, electrons are repelled and have difficulty entering the inner space of the pattern. It can be therefore considered that a negative charge flow of electrons becomes insufficient as compared to a positive charge flow of ions, and so excessive positive charges are stored on the gate wiring layer, and passed through the gate insulating film in the form of tunneling current which may damage the gate insulating film.

Figure 1A:
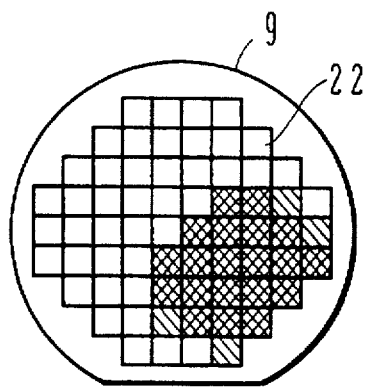
FIGS. 1A to 1C are plan views and a graph illustrating the experiments made by the inventor.
Figure 1B:
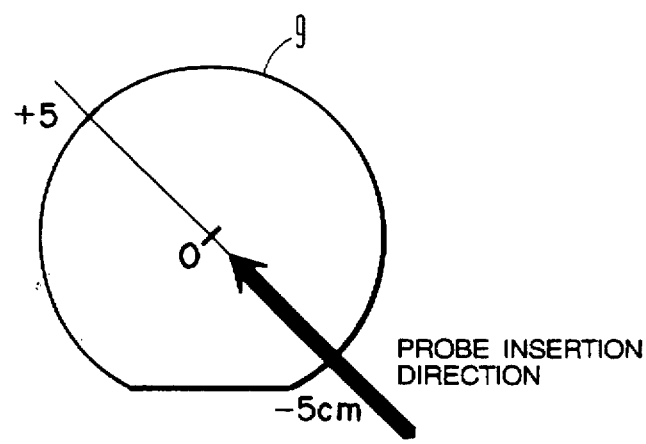
Figure 1C:
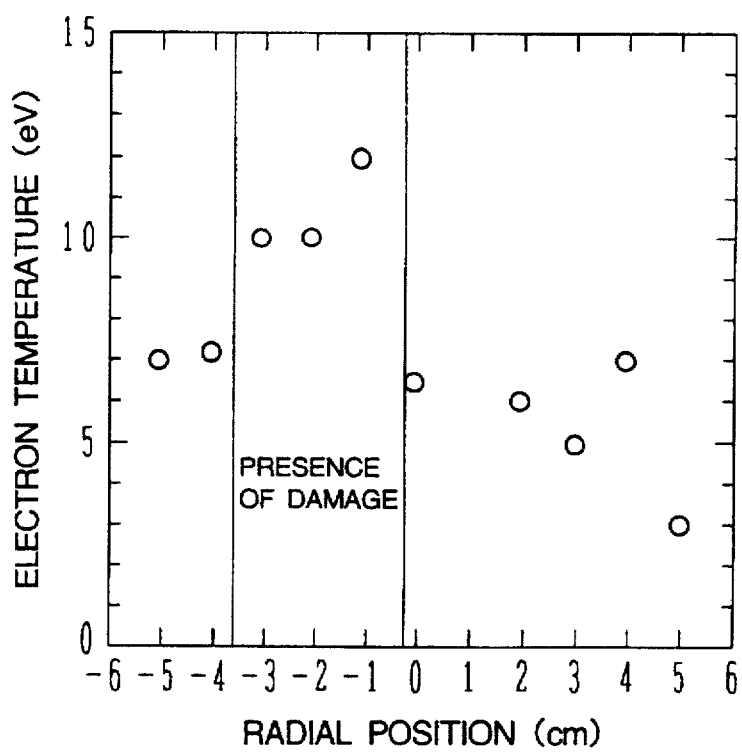

FIGS. 1A to 1C illustrate the experiments made by the inventor. FIG. 1A is a plan view illustrating the breakdown state of the gate insulating film of each chip on a wafer subjected to a plasma process. FIG. 1B is a schematic plan view illustrating the direction of moving a probe used for measuring an electron temperature of plasma. FIG. 1C is a graph showing electron temperature of a plasma measured by the probe, as a function of a chip position.

Figure 2A:
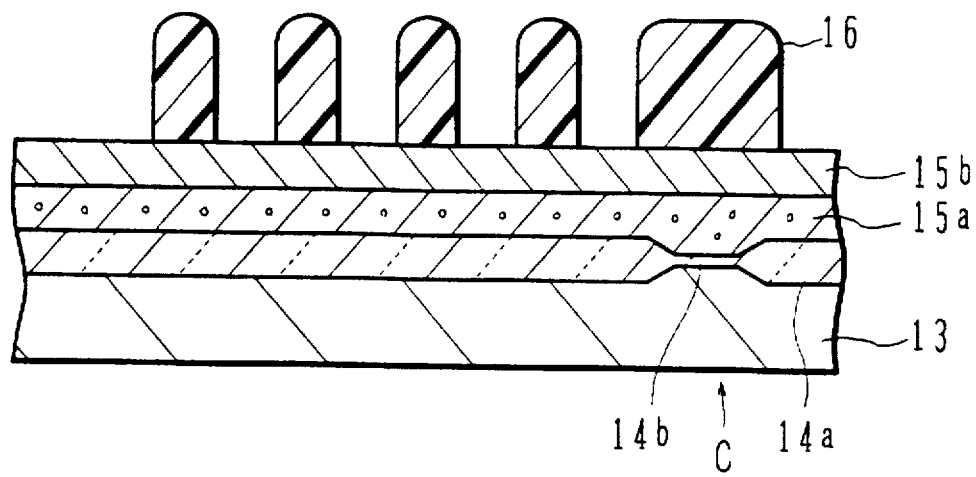
FIGS. 2A and 2B are a cross sectional view and a plan view showing a sample used by the experiments.
Figure 2B:
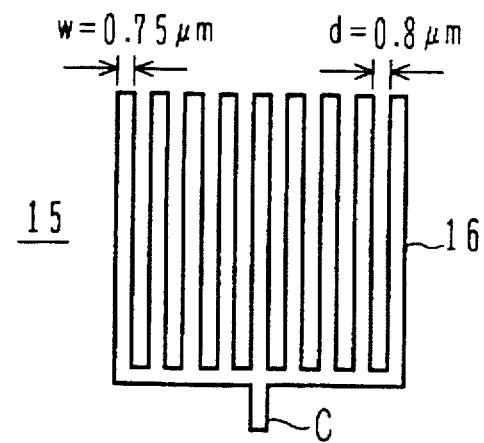

FIGS. 2A and 2B are a cross sectional view and a plan view showing the structure of a sample used by the experiments. A gate oxide film 14b of 8 nm thick is formed on the surface of a silicon substrate 13 at a region surrounded by a thick field oxide film 14a. A gate wiring 15 is formed on the field oxide film and gate insulating film, the gate wiring 15 being a laminate of a polysilicon film 15a and an aluminum layer 15b and constituting a MOS capacitor C. A dense wiring pattern 16 made of photoresist of 1.6 μm thick is formed on the gate wiring 15.

As shown in FIG. 2B, the photoresist pattern 16 has a plurality of wiring stripes juxtaposed at a distance $\underline{d}$ of 0.8 μm each having a width $\underline{w}$ of 0.75 μm. An aspect ratio of an opening is 2. These wiring stripes are connected in common to the MOS capacitor C at the lower portion in FIG. 2B.

Figure 3A:
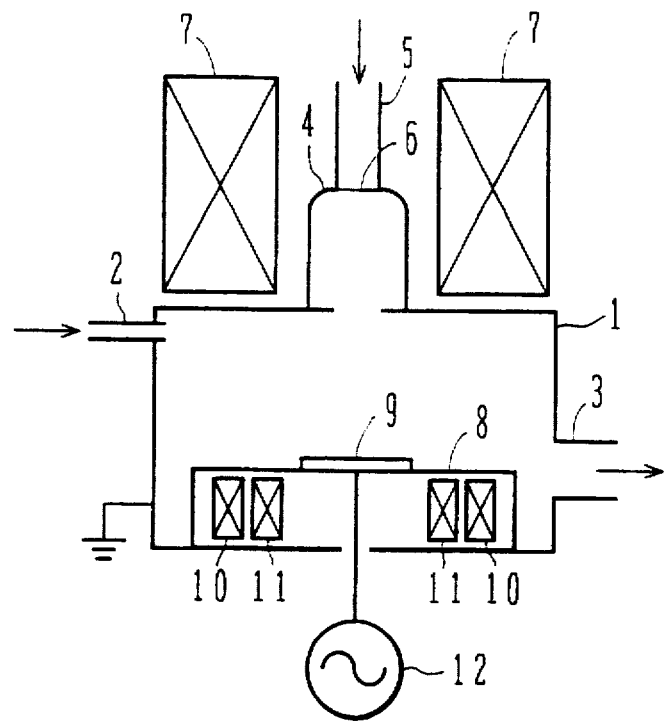
FIGS. 3A and 3B are a schematic cross sectional view and a schematic diagram illustrating an ECR plasma system and a Langmuir probe used by the experiments.

FIG. 3A shows the structure of a diverged magnetic field ECR plasma etching system by which samples were etched.

A reaction chamber 1 capable of being evacuated is coupled to a gas inlet port 2 and a gas outlet port 3. The gas inlet port 2 is connected to a predetermined etchant gas source. The gas outlet port 3 is connected to an evacuator. An opening is formed at the top of the reaction chamber 1 and communicates with a plasma generating chamber 4. The plasma generating chamber 4 and reaction chamber 1 constitute a hermetically sealed vessel.

A μ-wave transmissive window 6 made of, for example, quartz, is hermetically formed at the top of the plasma generating chamber 4 and coupled to a μ-waveguide 5. The μ-waveguide 5 introduces a μ-wave from a μ-wave generator to the plasma generating chamber 4.

A main coil 7 is disposed around the plasma generating chamber 4 for the generation of a diverged magnetic field in this chamber 4. The diverged magnetic field satisfies the ECR conditions.

A susceptor 8 for placing thereon a substrate (wafer) 9 is disposed at the lower portion of the reaction chamber 1, and connected to an RF bias source 12 which applies an RF voltage at 13.56 MHz to the susceptor 8. An outer coil 10 and an inner coil 11 are concentrically disposed below the susceptor 8.

Etchant gas is introduced from the gas inlet port 2 and exhausted from the gas outlet port 3 to form an etchant gas atmosphere at a predetermined pressure in the reaction chamber 1 and plasma generating chamber 4. While a magnetic field is generated by the main coil 7, a μ-wave is introduced from the μ-waveguide 5 into the plasma generating chamber 4 to thereby generate ECR plasma in the plasma generating chamber 4. This plasma drifts in the reaction chamber 1 because of the diverged magnetic field and reaches the substrate 9 placed on the susceptor 8.

An RF power at 13.56 MHz from the RF bias source is applied to the susceptor 8 to control the potential of the substrate 9 and generate a bias electric field which accelerates ions in the plasma toward the substrate 9. Under these conditions, an etching process was performed for samples on the substrate 9 by using plasma.

The etching conditions were a main coil current of 21 A, an outer coil current of 8 A, an inner coil current of 8 A, an etchant gas of $Cl_2+BCl_3$, a pressure of 0.6 Pa, a μ-wave power of 800 W, and an RF bias power of 180 W.

FIG. 1A shows the result of etching each sample formed on a chip 22 of the wafer 9 under the above etching conditions.

Formed on each chip 22 of the wafer 9 is a MOS capacitor having a gate insulating film thickness of 8 nm and connected to the antenna shown in FIGS. 2A and 2B. After the antenna is etched, the breakdown voltage of each MOS capacitor was measured.

A white square indicates a chip having a normal breakdown voltage, a cross-hatched square indicates a chip having an abnormal breakdown voltage and broken during the etching process. A square with hatches drawn toward lower right indicates a chip area having a sample with an antenna ratio of $10^6$, and the cross-hatched square indicates a chip area having a sample with an antenna ratio of $10^5$.

Samples with an antenna ratio of $10^4$ were also prepared and these samples were broken at generally the same regions where the samples with the antenna ratio of $10^5$ were broken.

It is understood from FIG. 1A that samples are broken not on the whole area of the wafer, but at particular regions. From another viewpoint, the gate insulating film is not broken at certain regions of the wafer. It can be considered that at the region indicated by the white square, the plasma is in a state capable of preventing damages of the gate insulating film.

The electrical property of plasma was measured by a Langmuir probe having compensating electrodes. FIG. 1B shows the direction of moving the probe along the surface of the wafer 9. The height of the probe above the wafer was set to about 4 cm.

Figure 3B:
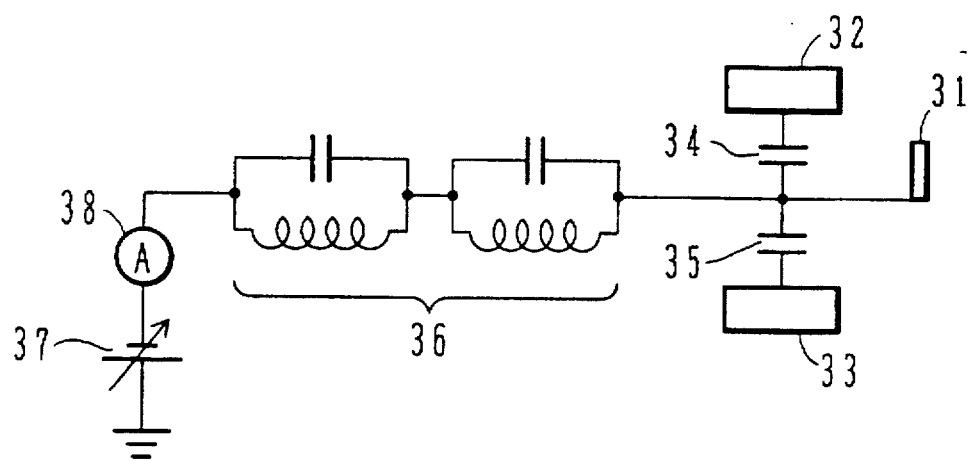

FIG. 3B is a schematic diagram showing the structure of a Langmuir probe. A platinum wire having a radius of 0.5 mm and a length of 5 mm was used as a probe 31. Compensating electrodes 32 and 33 made of aluminum are connected via capacitors 34 and 35 to the probe 31. These compensating electrodes 32 and 33 compensate for a varying plasma potential.

The probe 31 is connected via a filter 36 for cutting off the used RF frequency, to a current meter 38 and one terminal of a variable voltage source 37. The other terminal of the variable voltage source 37 and the outer wall of the reaction chamber 1 are grounded.

The probe 31 is moved over the wafer 9 as shown in FIG. 1B, and at each radial position the current I was measured by the current meter 38 by sweeping the voltage V of the variable voltage source 37. From the measured V-I characteristics, $\Delta V/\Delta \ln I$ near at a floating potential where the current I becomes 0 was calculated and an electron temperature in eV unit was obtained by a know method.

FIG. 1C shows an electron temperature (eV) relative to the radial position on the wafer 9. The electron temperature distribution showed a distinct change at the regions where the samples were broken. At the regions where the samples were broken, the electron temperature was as high as about 10 eV, whereas at the regions where the samples were not broken, the electron temperature was about 7 eV or lower. It can be understood from these results that if an electron temperature in plasma is high, the gate insulating film with a structured antenna is likely to be broken.

The oxide silicon film of the gate insulating film of each sample is 8 nm thick and has a breakdown voltage of about 8 V. Therefore, samples are not damaged in the electron temperature range lower than the breakdown voltage of the gate insulating film, typically lower by about 1 eV or more.

Conversely, gate insulating films are damaged in the electron temperature range higher than the breakdown voltage of the gate insulating film, typically higher by about 2 eV or more.

The damage of the gate insulating film is likely to occur when the thickness of the gate insulating film is 10 nm or less, the antenna ratio is 500 or more, and the aspect ratio is more than 1. In particular, the damage of the gate insulating film occurs when the wafer diameter is 8 inches or more.

It is therefore preferable to set the plasma electron temperature all over the wafer surface lower than the breakdown voltage of a gate insulating film in order to prevent damages to the gate insulating film.

As above, it has been found that damages to be generated during a fine pattern etching process, even if plasma having a uniform property over the flat surface is used, can be prevented by controlling the electron temperature low all over the wafer. This mechanism may be considered in the following manner.

The following model may be applied to the mechanism that damages to an gate insulating film having a structured antenna are formed even if uniform plasma is used.

Figure 4A:
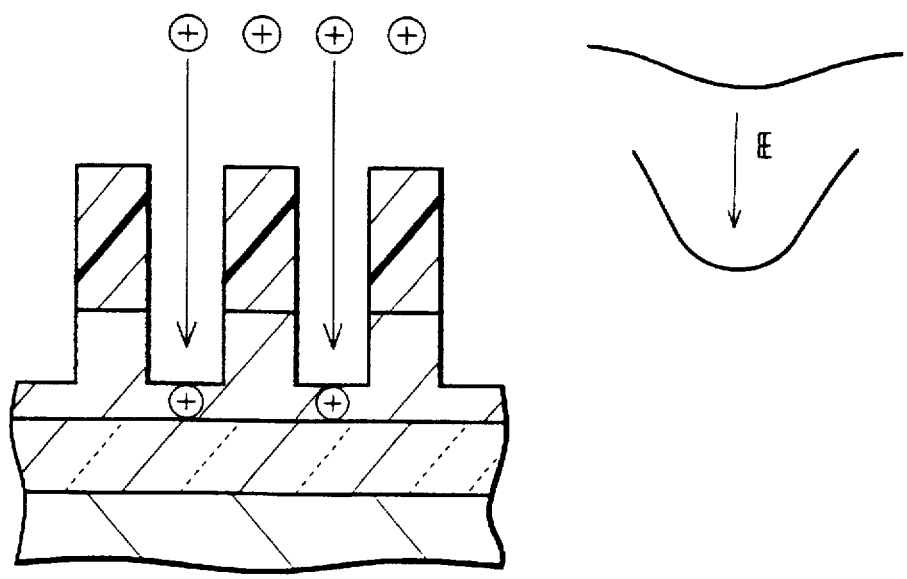
FIGS. 4A to 4C are schematic diagrams illustrating a charge-up of a substrate during a plasma process.

As shown in FIG. 4A, as a bias RF power is supplied to the substrate, the substrate is biased towards a negative potential relative to plasma. Ions in the plasma are accelerated towards the substrate by a electric field generated between the substrate and the plasma, and are incident upon the substrate generally vertically. Although the amplitude of the electric field between the substrate and the plasma is periodically changed by the bias RF power applied to the substrate, the direction (sign) thereof does not change. It can be considered therefore that positive ions are incident upon the substrate during the whole period.

Figure 4B:
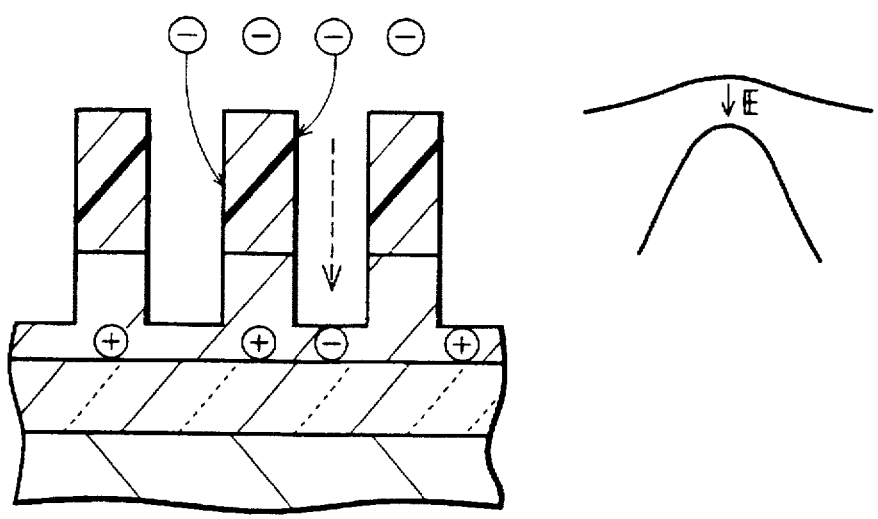

As shown in FIG. 4B, this electric field gives electrons a deceleration motion. It can be considered therefore that electrons are decelerated by the electric field and, reflecting the random motion of electrons in the plasma, most of them are obliquely incident upon the substrate. As electrons are obliquely incident upon the substrate, electrons are incident upon the side wall of the insulating pattern over the substrate. Electrons on a non-conductive region charge up this region.

Ions hardly collide with the upper side wall of the insulating pattern on the structured antenna, and only electrons collide with the upper side wall. As a result, negative charges are accumulated in the side wall. The accumulated negative charges form an electric field which repulses electrons. Electrons have difficulty entering the gaps between the patterns depending on the intensity of this electric field. It can be considered that the accumulation of negative charges in the upper side wall of the insulating pattern is governed by a lateral speed of electrons in the plasma.

The electron lateral speed changes with an electron temperature. If a percentage of electrons having a high lateral speed is large, negative charges accumulated in the side wall of the insulating pattern become large. A balance between the negative charge current of electrons and the positive charge current of ions flowing during the whole period cannot be achieved. It can be considered therefore that excessive positive current flows through the gate insulating film and damages it.

Figure 4C:
Figure 4C:
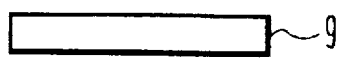

As the electron temperature is lowered, an average kinetic energy of electrons lowers and the number of high energy electrons reduces. The motion of electrons in the absence of an external force is considered to be random. As shown in FIG. 4C, consider now that the speed of an electron is separated into a vertical speed component $v_y$ in a Y-direction perpendicular to the substrate and a horizontal speed component $v_x$ in an X-direction parallel to the substrate surface. In the absence of an external force, the distribution of $v_x$ is identical or similar to that of $v_y$. When an electric field perpendicular to the substrate surface is generated, the vertical speed component $v_y$ is accelerated/decelerated by the electric field between the plasma and the substrate, whereas the horizontal speed component $v_x$ is rarely affected by the electric field. It can be considered that as the electron temperature is lowered, the horizontal speed component $v_x$ of electrons reduces and therefore negative charges accumulated in the upper side wall of the insulating pattern reduce. If it is considered that the vertical speed component $v_y$ of electrons is maintained generally constant by the interaction with the electric field, regardless of the electron temperature, then the lower the electron temperature, the less the charge-up amount in the upper side wall and the larger the electron current flowing into the substrate. It can be considered that such a mechanism suppresses excessive positive charges incident upon the substrate when the electron temperature is lowered.

The amount of incident electrons upon the substrate is not constant throughout the whole period. If a bias electric field generated between the plasma and the substrate is strong, electrons are repulsed by this strong electric field and cannot reach the substrate. It can be considered that electrons can be incident upon the substrate only during the period while electrons are allowed to reach the substrate because the bias electric field between the substrate and the plasma is weak. The electric field generated by an RF bias between the plasma and the substrate changes with the frequency of the RF bias.

The frequency of the RF bias source 12 of the ECR plasma etching system shown in FIG. 2A was changed from 13.56 MHz to 400 kHz. At this low frequency, damages to the gate insulating film were not found over the whole surface of the wafer. This phenomenon may be considered as in the following.

As the bias frequency is lowered, the time duration while the electric field generated between the plasma and the substrate is strong, is prolonged. During the period while the electric field is strong, ion positive charges are incident upon the substrate. As a result, the amount of positive charges per one cycle accumulated on the substrate becomes large. According to the calculation by the inventor, the amount of positive charges accumulated in the substrate in one cycle is not so much that the positive charges damage the gate insulating film.

As the amount of positive charges accumulated in the substrate becomes large, when the electric field becomes weak, the period while the substrate potential takes a value near to the plasma potential, becomes long. During this period, the absolute value of the electric field also becomes weak and the substrate potential takes a value nearer to the plasma potential. As a result, electrons having lower energies become incident upon the substrate. Taking only electrons incident upon the substrate into consideration, an effective electron temperature of incident electrons lowers.

A lower electron temperature is effective for preventing damages to the substrate. However, since this electron temperature stands for those electrons effectively incident upon the substrate, the electron temperature is not necessarily required to be low during the period while electrons are not incident upon the substrate.

The electron temperature may be lowered by raising the pressure of a plasma atmosphere, lowering a μ-wave power, or adding gas having a low ionization potential.

The current of the inner coil 11 of the ECR plasma system shown in FIG. 3A was changed from +8A to −8 A. At this current, no damage was found throughout the whole surface of the wafer.

Also at 0 W of the RF bias power, no damage was found throughout the whole surface of the wafer. It can be considered that under these conditions, the electron temperature of electrons effectively incident upon the substrate lowers as well.

Only electrons having a high kinetic energy can contribute to the current I near the floating potential. Therefore, the electron temperature measured near the floating potential reflects electron components of a high kinetic energy. The process of accumulating negative charges in the upper side wall of the insulating pattern may be considered as being governed mainly by high kinetic energy electrons. It can be considered that when the antenna potential is raised, electrons become attracted. Also, by lowering the electron temperature, electrons become easier to accumulate. Therefore, when the upper limit of the electron temperature is lowered in accordance with the breakdown voltage, damages should be suppressed. It can be considered therefore that the electron temperature is preferably controlled by paying attention to electron components having a high kinetic energy.

The above experiments used a gate insulating film of 8 nm thick. If a thinner gate insulating film is used, it can be considered that the potential of the antenna conductor rises to a value near the breakdown voltage of the gate insulating film. It is preferable therefore to set the electron temperature of plasma to a value of the breakdown voltage or lower of the gate insulating film.

It can be considered that as the energy supplied to plasma is modulated, the electron temperature changes with the modulation of the supplied energy. This will be described by taking an inductive coupled plasma etching system as an example.

Figure 5:
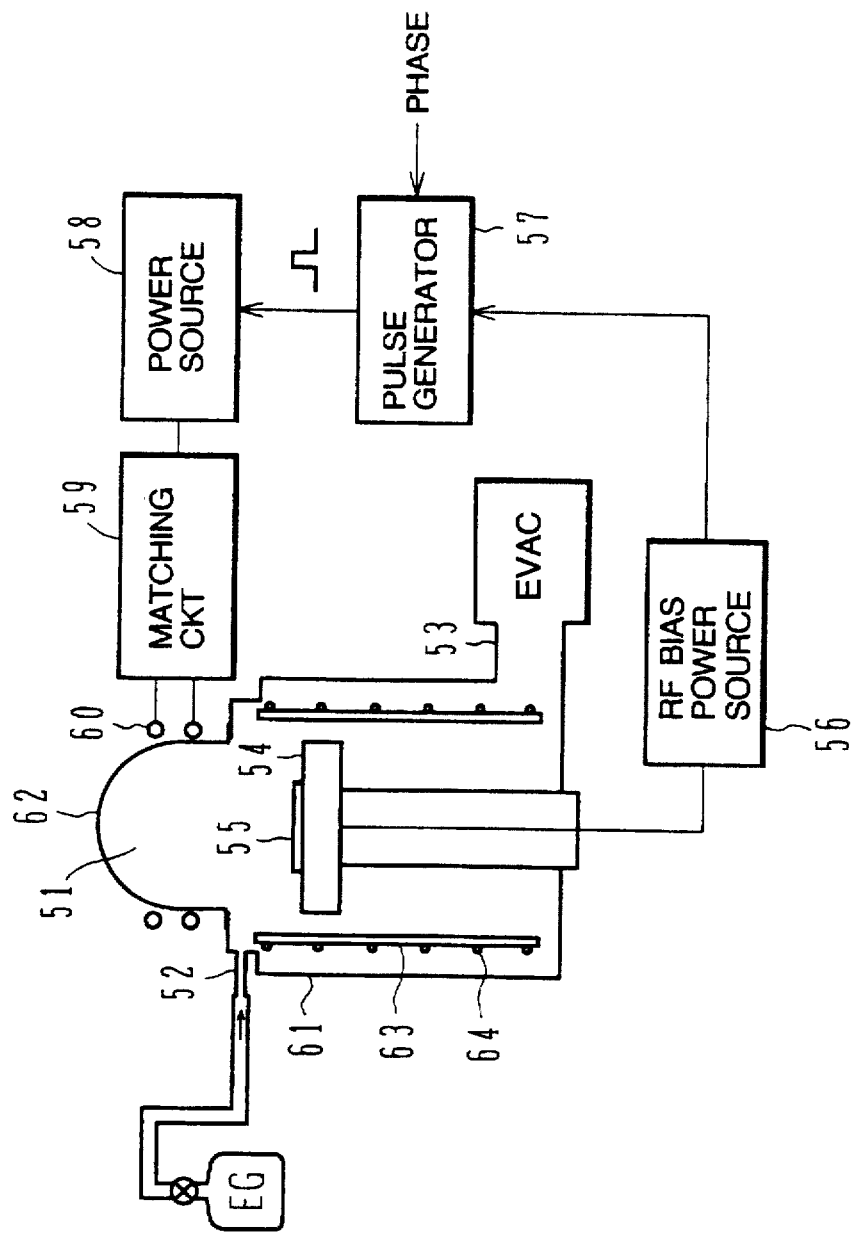
FIG. 5 is a schematic diagram partially in block illustrating an inductively coupled plasma system used by the experiments.
Figure 6A:
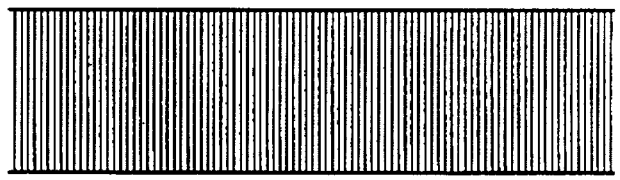
FIG. 6 shows waveforms illustrating the operation of the plasma system.
Figure 6B:
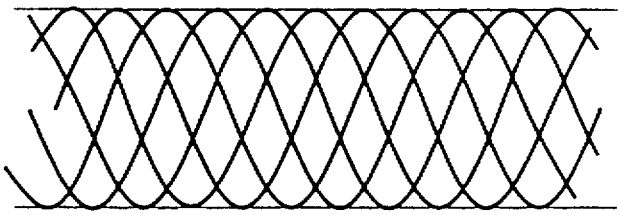
Figure 6C:
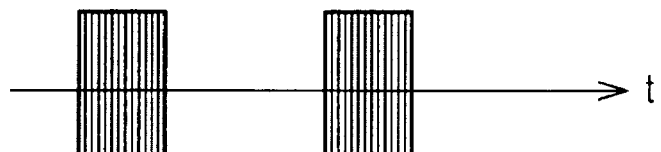
Figure 6D:
Figure 6E:
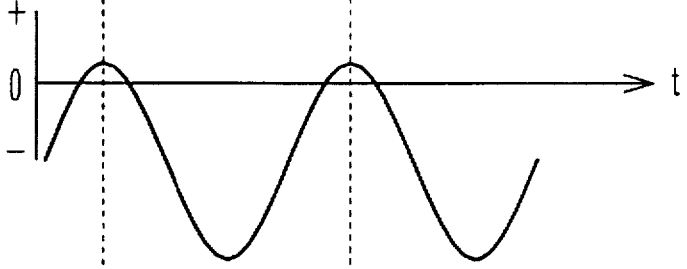
Figure 6F:
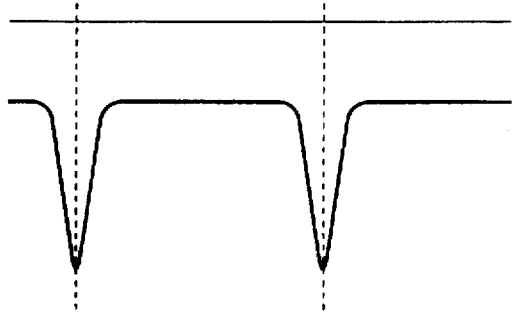

FIG. 5 is a schematic diagram partially in block of an inductive coupled plasma etching system according to an embodiment of the invention. A belljar 62 made of ceramic material is mounted on an outer vessel 61 made of stainless steel or the like. The belljar 62 and outer vessel 61 constitute a hermetic reaction chamber 51. A gas inlet port 52 and a gas outlet port 53 are connected to the reaction chamber 51. An etchant gas source EG is connected to the gas inlet port 52, and an evacuator EVAC is connected to the gas outlet port 53.

A two-turn coil 60 is disposed around the ceramic belljar 62 and connected via a matching circuit 59 to an RF power source 58. An RF power at 13.56 MHz is supplied from the power source 58 to the coil 60 to inductively supply an RF power into the reaction chamber 51. Etchant gas is introduced from the gas inlet port 52 into the reaction chamber and exhausted from the gas outlet port 53 to maintain a predetermined pressure in the reaction chamber 51. As the RF power at 13.56 MHz is supplied to the reaction chamber 51, plasma is generated in the reaction chamber 51. This plasma reaches the surface of a substrate 55 placed on a susceptor 54.

The susceptor 54 is connected to an RF bias power source 56 having a built-in matching circuit. An RF power at a desired frequency (typically 66.7 kHz) is supplied from the RF bias power source 56 to the substrate 55 to regulate its potential, to accelerate ions in the plasma to a desired energy, and to collide ions with the substrate 55.

An RF signal having a waveform similar to the RF output waveform is picked up from the RF bias power source 56 and supplied to a pulse generator 57. The pulse generator 57 generates a pulse train having the same repetition period as the inputted RF signal and a desired on-period synchronous with a desired phase. This pulse signal is supplied to the RF power source 58 to on-off modulate the RF power at 13.56 MHz. The plasma exciting power is therefore on/off modulated synchronously with the substrate bias.

In the reaction chamber 51, on/off modulated plasma is generated, and an RF bias synchronous with the on/off modulation of the plasma is applied to the substrate 55.

An inner vessel 63 capable of controlling the temperature by a heater 64 is disposed around the susceptor 54.

By controlling the temperature, the composition of the plasma can be adjusted. The inner vessel 63 is grounded so that the plasma potential is suppressed from being fluctuated by the RF bias power supplied to the susceptor 54.

FIG. 6 shows waveforms illustrating the operation of the plasma etching system described above. A waveform (a) shows in a simplified form a power waveform of a plasma exciting power source in an continuous operation.

A waveform (b) shows in a simplified form a voltage waveform of the RF bias power source. As shown, the RF bias waveform has various phases if it is not synchronized with the plasma exciting power source.

A waveform (c) shows in a simplified form a power waveform on/off modulated. While the power source is turned on, exciting energy is supplied to the plasma. While the power source is turned off, the supplied plasma exciting power is "0".

A waveform (d) shows in a simplified form an electron temperature of plasma excited by the power source having the waveform (c). While the power source is turned on, electrons are accelerated and the electron temperature rises. It is assumed that the power source is turned off while the electron temperature rises. As the power source is turned off, electrons in the plasma are not accelerated and inelastically collide with atoms, molecules, and ions of the plasma and the wall of the reaction chamber, while reducing their energy. Therefore, the electron temperature gradually lowers. In the above manner, as the power source is on/off modulated, the electron temperature rises/lowers synchronously with on/off of the power source.

A waveform (e) is an RF bias waveform synchronized with the power source so as to take a maximum potential when the power source changes from its off-state to an on-state. Assuming that electrons flow into the substrate when the RF bias takes its maximum potential, the electron temperature is lowest at this timing. Namely, the effective electron temperature of electrons flowing into the substrate is set to a lowest value. A waveform (f) is a waveform of electron current of the plasma flowing into the substrate when the RF bias having the waveform (e) is applied.

As shown by the waveform (b), if the RF bias source is made asynchronous with the on/off of the power source, timings when electrons flow into the substrate are asynchronous with the modulation of the power source and the effective electron temperature is possibly an average value of the waveform (d), or may be dominated by the maximum value of the waveform (d).

In order to verify the above study, the following experiments were made.

Figure 7A:
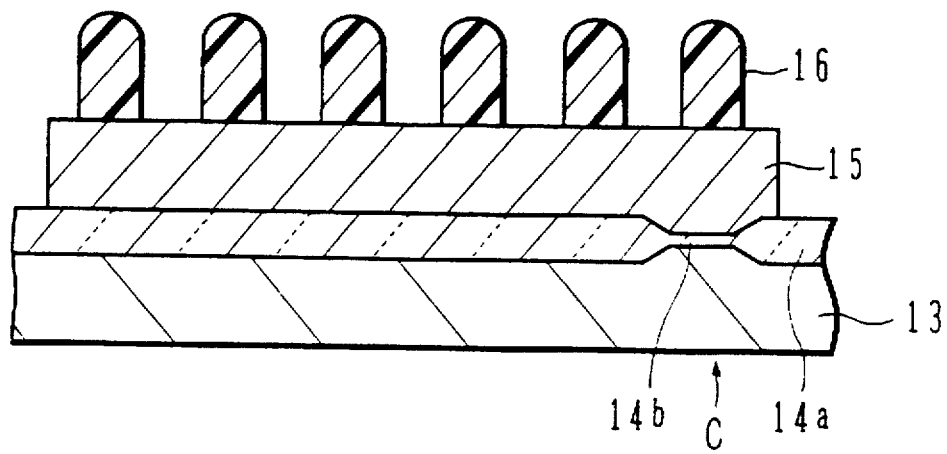
FIGS. 7A and 7B are a cross sectional view and a plan view of a sample used by other experiments done by the inventor.
Figure 7B:
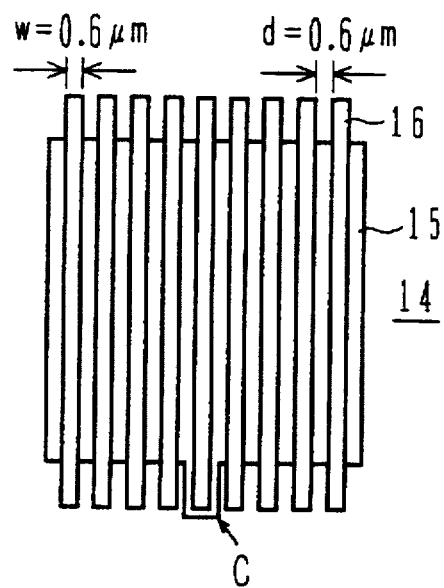
Figure 8A:
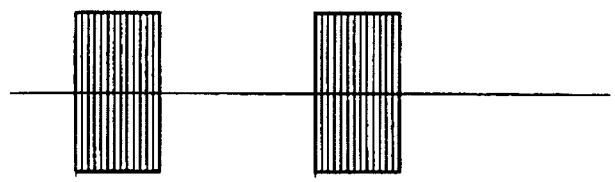
FIG. 8 shows waveforms illustrating the operation of the plasma system in the experiments.
Figure 8B:
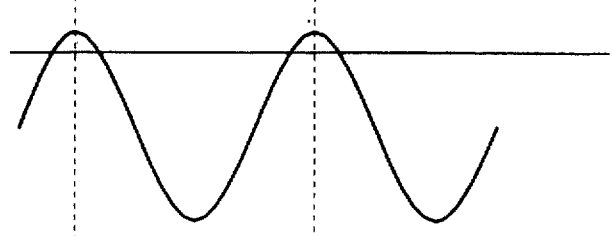
Figure 8C:
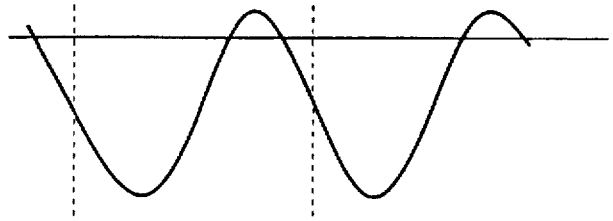
Figure 8D:
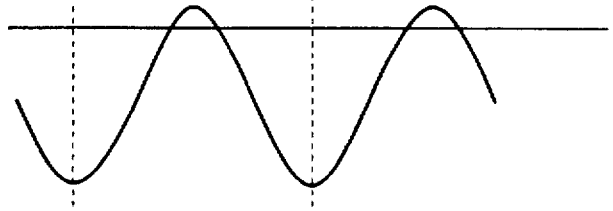
Figure 8E:
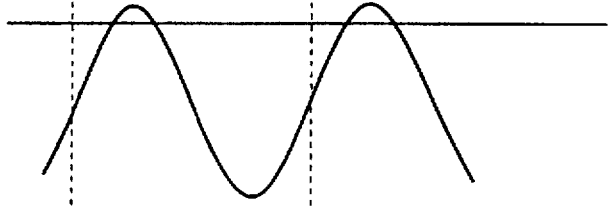

FIGS. 7A and 7B show the structure of a sample used by the experiments. FIG. 7A is a cross sectional view of the sample. On the surface of a silicon substrate 13, a thick field oxide film 14a is formed by local oxidation of silicon (LOCOS). In an opening region defined by the field oxide film 14a, a gate oxide film 14b of 6 nm thick is formed. A gate wiring layer 15 is formed on the gate oxide film 14b and field oxide film 14a.

Similar to the gate wiring layer shown in FIG. 2A, the gate wiring layer 15 is a laminate of a polysilicon layer and an aluminum layer. A resist mask 16 is formed on the gate wiring layer 15. The resist mask 16 is 1.2 μm thick, and as shown in FIG. 7B has a plurality of parallel stripes each having a width w of 0.6 μm a space d of 0.6 μm. An aspect ratio of each opening is 2.

As shown in FIG. 7B, the gate wiring layer 15 is partially protruded downward and a MOS capacitor C is formed at this area. The cross section of FIG. 7A is drawn in a simplified form and does not coincide with the plan view of FIG. 7B in a strict sense.

FIG. 8 illustrates the phase relation of the on/off modulation of the power source and the synchronized RF bias, respectively used by the experiments. The phase angle θ is a lead angle of the maximum potential of the RE bias from the phase 0° of the power source when it is turned on. The lead angles θ were set to 0°, 90°, 180°, and 270°. As the on/off modulation of the power source, the on-period was set to 5 μsec and the off-period was set to 10 μsec. Therefore, when the maximum potential of the RF bias synchronizes with the end of the on-period, the phase angle of the RF bias is 240°.

For the comparison, the continuous operation of the power source shown by the waveform (a) of FIG. 6 was measured. Also, the experiments of the asynchronous operation (waveform (b) of FIG. 6) of the RF bias asynchronous with the on/off of the power source were made.

When samples connected to a surface exposed antenna were used, damages during the plasma etching were not found even with an antenna ratio of 1,000,000. As the plasma process conditions, Ar gas was used at a pressure of 0.53 Pa, an average power source was set to 100 W, and the RF bias power source was set to 22 W. The ion current density measured with a Langmuir probe was about 1 mA/cm$^2$.

In the on/off modulation experiments of the power source illustrated in FIG. 8, the on-period was set to 5 μsec and the off-period was set to 10 μsec. Therefore, the repetition frequency is 66.7 kHz. The asynchronous RF bias was set to 60 kHz. The power of 300 W was supplied from the power source during the on-period to establish an average power of 100 W.

Figure 9:
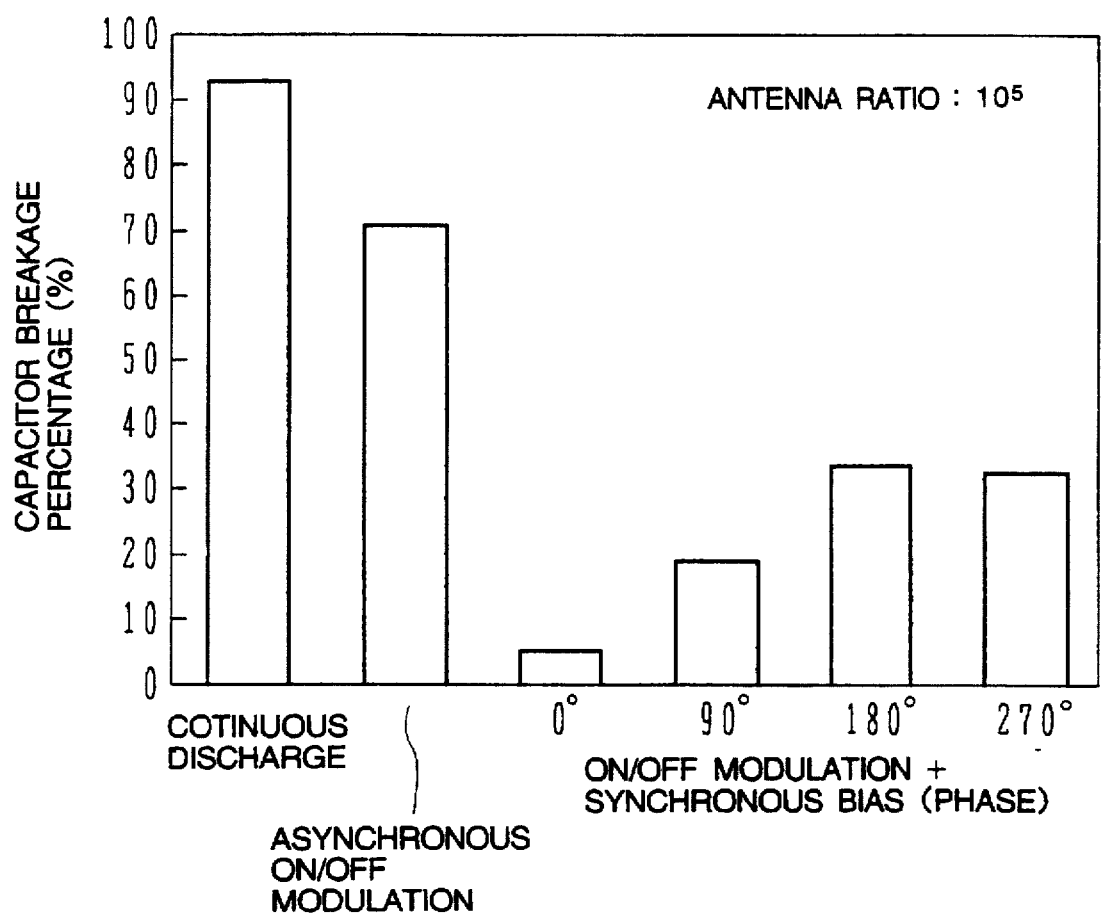
FIG. 9 is a graph showing the experimental results.

FIG. 9 shows the experiment results. The abscissa represents the type of plasma discharge, and the ordinate represents a capacitor breakage rate in percentage (%). Samples whose capacitor breakage percentage were measured had an antenna ratio of 10$^5$. The capacitor breakage percentage of the continuous discharge was 90% or higher, which is a probability of near 100%. The capacitor breakage percentage of the on/off modulation of the power source was lowered to about 70%, which may be considered as resulting from an average electron temperature lowered by the on/off modulation of the power source.

When the synchronized RF bias is applied at the phase angle of 0° the breakage percentage lowered to about 5% showing a remarkable improvement which cannot be expected if the asynchronous RF bias is applied. As the phase angle is increased from 0° to 90° and 180°, the breakage percentage increases.

Since the on- and off-periods were set differently, the phase angle 180° is during the off-period. The experiment results of the phase angles 0°, 90° and 180° during the off-period indicate that as the lead angle of the RF bias during the off-period advances, the capacitor breakage percentage gradually increases.

The phase angle 270° is during the on-period and the experimental data is different from the other phase angles. The obtained capacitor breakage percentage was similar to that of the phase angle 180°. The reason why the capacitor breakage percentage for all the four phase angles is lower than that of the asynchronous RF bias, is not clear to date.

From the above experimental results, it can be assumed that the electron temperature lowers depending upon the degree or fraction of modulated plasma exciting power, and when the RF bias is synchronized with the on/off modulation the electron temperature of those electrons incident upon the substrate changes during each cycle depending on the phase of the RF bias. The minimum electron temperature is achieved when the plasma exciting power changes from "OFF" state to "ON" state.

The repetition frequency of "ON" and "OFF" cycle is not necessarily the same as the RF bias frequency. For example it may be ½ or ¼ of the RF bias frequency.

The repetition frequency is preferably selected in a frequency range of 5–500 kHz from the point of thermal relaxation of electrons, and from the point of maintaining plasma.

The plasma exciting power preferably has a frequency which is 5 or more times as high as the repetition frequency. The plasma exciting power preferably has three or more cycles in each "ON" duration.

The time duration while electrons are injected is not "0" in a practical sense, but has a certain time duration. Therefore, strictly speaking, the "timing when the RF bias takes the maximum potential" described above should be considered as the period while main part (typically 90%) of electron current is injected. It is preferable to control the average electron temperature to be minimum during this period. As shown in FIG. 6, in the case of on/off modulation with different on- and off-periods, the optimum phase of the RF bias is an angle slightly led from 0°. Practically, it is possibly preferable to set the phase angle of the RF bias in the range from (0–30)° to (0+60)°.

The substantial minimum value of the electron temperature can be considered to be from the real minimum value Temin to Temin+0.3 (Temax−Temin), wherein Temax is the real maximum value of the electron temperature. The substantial maximum value of the substrate potential can be considered as from the real maximum value Vsmax to Vsmax−0.1 (Vsmax−Vsmin), wherein Vsmin is the real minimum value of the substrate potential.

Ar gas was used in the experiments for the convenience of the measurement with a Langmuir probe or other reasons. Other gases are used in the practical manufacture process of a semiconductor device.

For example, an SiO$_2$ film may be etched by using C$_4$F$_8$ gas. By using the etching system shown in FIG. 5, MOS capacitors connected to the structured antenna like that described above were processed. The SiO₂ film was etched at an etching rate of 500 nm/min. under the conditions of a continuous discharge of the power source, a source power of 2.5 kW, and an RF bias power of 250 W. When the above-mentioned samples were processed with this plasma, the capacitor breakage percentage was 93% at the antenna ratio of $10^6$.

Under the conditions of on- and off-time periods of 5 μsec and 5 μsec, a source power of 2.5 kW, and a synchronous RF bias power of 250 W at 100 kHz, respectively during the on-period, the SiO₂ film was etched at an etching rate of 330 nm/min. The capacitor breakage percentage was 88%.

Under the conditions of on- and off-time periods of 5 μsec and 10 μsec, a source power of 2.5 kW, and a synchronous RF bias power of 250 W at 66.7 kHz, respectively during the on-period, the SiO₂ film was etched at an etching rate of 210 nm/min. The capacitor breakage percentage was 4%.

With the prolonged off-period, damages were considerably reduced. It can be considered that as the off-period is prolonged, the period while the electron temperature lowers is prolonged so that the electron temperature at the end of the off-period lowers further. It can be considered that a remarkable reduction of damages depends at least on a lowered electron temperature.

Strictly speaking, however, in the above experiments, it is conceivable that an average value of the power source as well as an ion current density changes. Therefore, the remarkable reduction of damages does not probably depend only upon the off-time effects.

If the off-period is prolonged too much, the frequency of the RF bias power becomes too low and the RF bias becomes difficult to be applied. If the power source is increased and the plasma density becomes too high, the rise of a substrate potential may be clamped. This may be considered as resulting from a lowered impedance between the substrate and the plasma when the substrate potential rises and a relatively raised impedance between the substrate and the RF bias power source. This phenomenon becomes conspicuous when a substrate is attracted and attached by an electrostatic chuck.

In such a case, an apparent optimum phase changes and a phase near 180° becomes the optimum phase in some cases. However, the maximum effects can be obtained at the original optimum phase if the actual potential change of the substrate is measured and the impedance between the substrate and the RF bias power source is set substantially small so as to obtain a waveform near a sinusoidal wave at a desired repetition frequency.

Figures 10A, 10B, 10C, 10D, 10E:
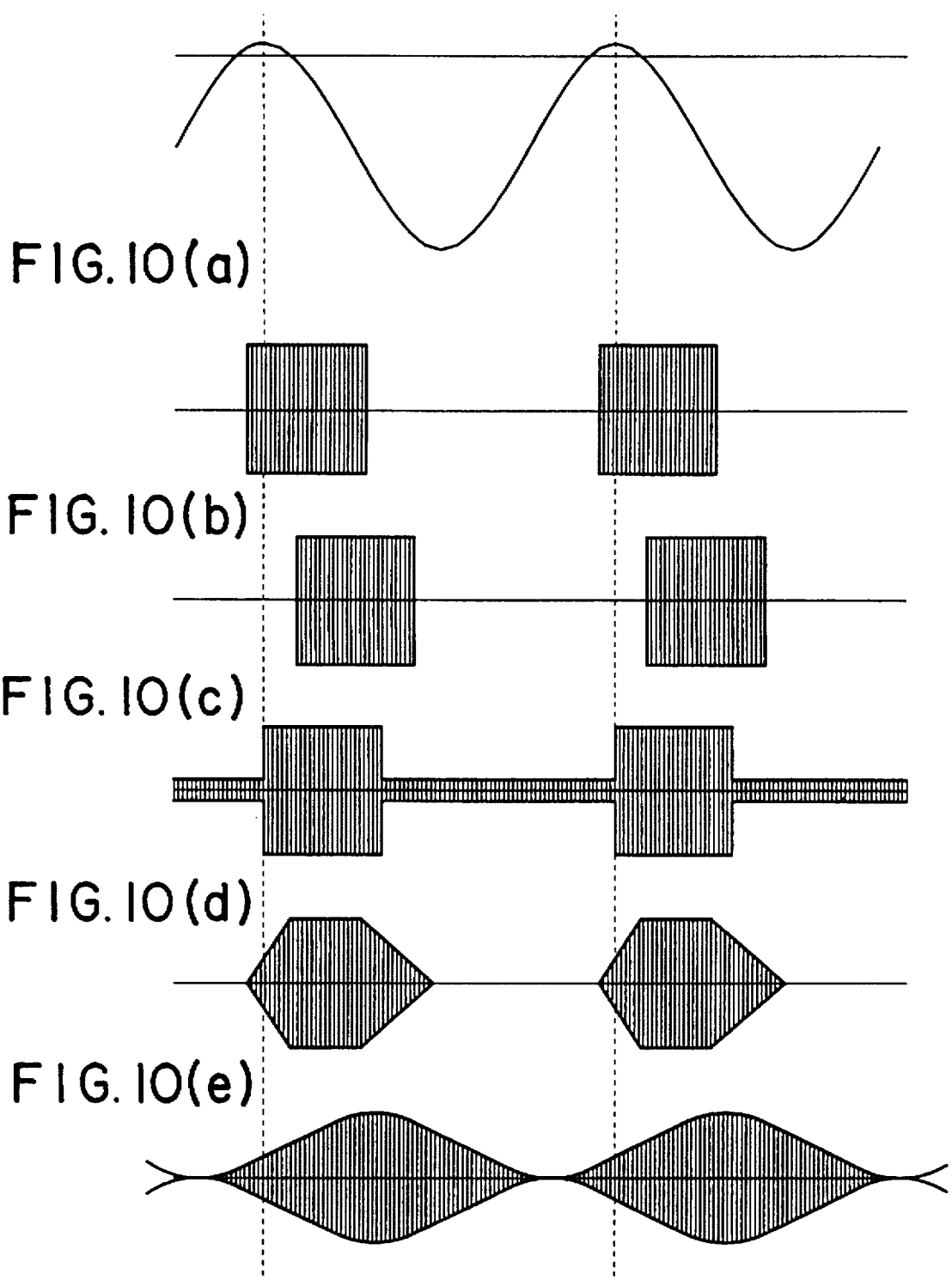
FIG. 10 shows waveforms illustrating modifications of a plasma process.

FIG. 10 illustrates various methods of modulating plasma exciting energy. A sine wave shown in the highest row is a waveform of an RF bias power source. Waveforms (a) to (e) shown in the lower rows are modulation waveforms of the plasma exciting energy.

The waveforms (a) and (b) illustrate a phase change from 0° during the on/off modulation. If the highest potential of the RF bias is during the on-period of the plasma exciting power source, the allowable range of the phase angle is from about -30° to 0°. If the highest potential of the RF bias is during the off-period of the plasma exciting power source as indicated by the waveform (b), the allowable range of the phase angle is from about 0° to 60°.

In the above examples, the plasma exciting power source was completely turned on and off. It is not necessarily required that the plasma exciting power is completely intercepted during the off-period. The plasma exciting power may be switched by two steps between strong and weak, to lower the electron temperature during the weak period.

The waveform (c) illustrates this case. The plasma exciting power is modulated by two strong and weak steps. The RF bias takes the highest potential at the timing when the plasma exciting power changes from the weak state to the strong state.

The waveforms (d) and (e) illustrate other modifications. The waveform (d) illustrates the plasma exciting power having a time constant at its rise and fall edges. In this case, it is preferable to control the phase of the RF bias power source in accordance with the speed of the rise edge. For example, the phase angle is controlled so that the RF bias takes the highest potential when the plasma exciting power rises 10% or higher.

In the case of the waveform (e), the plasma exciting power changes generally sinusoidally. Also in this case, it is preferable to control the phase angle so that the RF bias takes the highest potential during the course while the plasma exciting power changes from the weak state to the strong state. For example, the phase angle is controlled so that RF bias voltage takes the highest value when the plasma exciting power rises to 25% or higher of the maximum value thereof.

Figure 11:
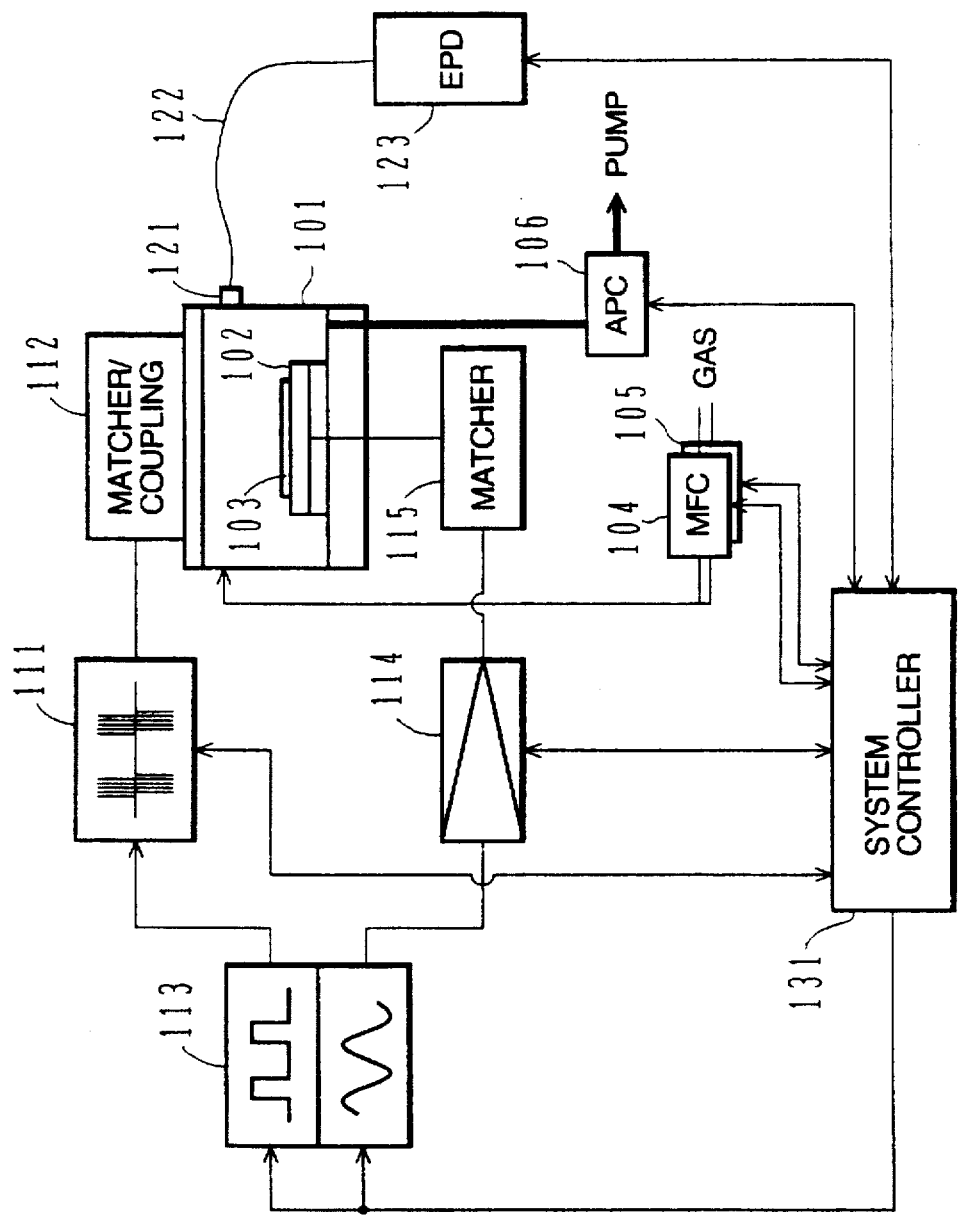
FIG. 11 is a schematic diagram partially in block illustrating a plasma process system according to another embodiment of the invention.

FIG. 11 is a schematic diagram in block showing a plasma processing system according to another embodiment of the invention. A susceptor 102 is disposed in a hermetic vessel 101 and grounded. A substrate 103 is electrostatically attracted and attached to the susceptor 102. The temperature of the susceptor 102 is controlled and helium gas is introduced between the substrate 103 and the susceptor 102. The substrate 102 is heated/cooled by the helium gas and maintained at the same temperature as the susceptor 102. Process gases whose flow rates are controlled by mass flow controllers 104 and 105 are introduced into the vessel 101. This gas supply systems may be increased to three or more series of systems if necessary, or reduced to one series of system. The vessel 101 is coupled via an auto-pressure controller 106 to a vacuum pump so that the vessel 101 can be evacuated while controlling the internal pressure.

An RF (or μ-wave) power from an RF (or μ-wave) oscillator 111 is applied to the gases in the vessel 101 via a matcher/coupling means 112 to discharge the gases in a plasma state. Combinations of the coupling means 112 and plasma exciting power supply make various types of plasma, such as capacitive coupled plasma using parallel plate electrodes, inductive coupled plasma using a coil wound about the vessel 101, inductive coupled plasma using a plate type coil (TCP coil) mounted on the vessel 101, helicon wave plasma using both RF wave and magnetic field, ECR plasma using both μ-wave and magnetic field, and surface wave excitation plasma using μ-wave and dielectric line.

An RF power is applied to the susceptor. In the structure shown in FIG. 11, a sine wave signal is supplied from one output terminal of a two-channel waveform generator 113 to an RF amplifier 114 which amplifies the sine wave signal and supplies it to the susceptor 102 via a matcher 115. A rectangular wave is supplied from the other output terminal of the two-channel waveform generator 113 to the RF (or μ-wave) oscillator 111. The oscillator 111 is amplitude-modulated by this rectangular wave.

An optical fiber 122 is guided via a window 121 into the vessel 101 to transmit plasma radiation to an end point detector (EPD) 123. The end point detector 123 detects an intensity change in light having a wave length set to the detector 123, and monitors the progress of process.

A system controller 131 controls the total operation of the system and includes a transport mechanism for the substrate 103. The system controller 131 sends the setting value of each gas to the mass flow controllers 104 and 105 which return the actual gas flow. A setting value of a pressure is supplied to the auto-pressure controller 106 which returns an actual pressure. Setting values of a plasma exciting power and an RF bias power are supplied to the RF (or μ-wave) oscillator 111 and the RF bias power source 114, respectively, which return the values of actual powers. These actual values are read frequently and returned to the system controller 131 from the matcher/coupler 112 or matcher 115.

A phase difference or other parameters are supplied to the waveform generator 113. Parameters such as a detected wave length and a detection condition are supplied to the end point detector 123 which returns an end point signal. The system controller 131 has a built-in timer and can control the operation of the system in accordance with the preset timings. By presetting a series of process conditions to the system controller, the substrate 103 can automatically undergo a plasma process.

The RF oscillator 111 is amplitude-modulated by the rectangular signal supplied from the two-channel waveform generator 113, and the RF amplifier 114 power-amplifies the sine wave signal supplied from the two-channel waveform generator 113. These modulation and amplification as well as other process parameters can be automatically set or changed by the system controller 131. In this manner, the plasma generation condition and RF bias condition can be changed as desired during the plasma process.

Instead of the two-channel waveform generator 113, a single sine wave generator may be used in which the system controller supplies a control signal indicating whether an output of the single sine wave generator is used for modulating the plasma exciting power. In this case, a trigger level and a pulse width are made capable of being set, and a phase and an on/off periods are made variable. Alternatively, a single rectangular wave generator may be used in which the system controller supplies a control signal indicating whether an output of the single rectangular wave generator is used for modulating the plasma exciting power. In this case, only the fundamental component of the rectangular wave is amplified and the phase is shifted to use it as the RF bias power source.

FIG. 12 illustrates a plasma process to be performed at two steps.

The flow rates of gases 1 and 2 and the pressure in the vessel are set. After the setting conditions are satisfied and stabilized, the off-period is set to "0", i.e., the continuous operation is set and the plasma exciting power source is turned on and then the RF bias power source is turned on. After a predetermined time lapses (or when an end point is detected), the RF bias power source and plasma exciting power source are sequentially turned off.

Next, the gas flow rates and the pressure for the second step are set. After the setting conditions are satisfied and stabilized, the on-period is set to, for example, 10 μsec to output a sine wave synchronized with the pulse waveform from the two-channel waveform generator 113. If the on-period is set to, for example, 5 μsec, the frequency of the sine wave is 66.7 kHz. In response to these sine waves and rectangular waves, the plasma exciting power source and RF bias power source are turned on again to perform the plasma process at the second step. After a predetermined time lapses, the power sources are turned off, the supply of the gases is stopped, and the gases in the vessel are exhausted to terminate the plasma process.

The operation sequence is not limited to the above sequence. It is not necessarily required to change all parameters at each step. The plasma process may be performed at three or more steps. The on-period may be changed during the plasma process, and each parameter may be increased or decreased to make it optimum if necessary.

The above-described methods can be applied, for example, to etching of a gate electrode, etching of a contact hole on a gate electrode, etching of a wiring connected to a gate electrode, etching of a via hole on this wiring, plasma cleaning in a contact or via hole, or film formation by plasma CVD on a gate electrode and/or gate wiring.

Damages to a gate electrode or a wiring during a patterning process are formed near at the end of the patterning process. A conductive material is left only between narrow pattern stripes, and the etching is completed at the region where broad patterns are formed. Therefore, the structured antenna is connected to the gate electrode or wiring. During the period while a conductive material is left at the broad pattern region, the conductive material layer has usually an electrical connection to the substrate at some point thereof. In this case, a high electron temperature causes no trouble in many cases. Therefore, if the continuous discharge is desired from the view point of process efficiency or the like, the continuous discharge is performed immediately before the end of the etching, and thereafter both the on/off modulation and synchronized RF bias are used. The on/off modulation and synchronized RF bias may be used immediately before and after the end of the etching.

Damages to a conductive material layer during a process of forming a contact hole or a via hole are formed near at the end of the process while the conductive material layer is exposed. Therefore, the continuous discharge is switched to the on/off modulation and synchronized RF bias before the end of the process. In this case, the patterning precision is possibly improved.

For example, in etching a via hole, first the continuous discharge is performed and immediately before the end of the process, the operation by the on/off modulation and synchronized RF bias is performed. In this manner, charging damages can be reduced without lowering the throughput too much. In etching a wiring layer, the continuous discharge may be performed again after sufficient time lapses after the detection of the end point.

In order to change the conditions of a process while it is performed, it is preferable that the system controller of the plasma system can perform various functions such as switching between the continuous discharge operation and the modulation operation of the plasma exciting power source, setting a pulse width, changing a frequency of the RF bias power source, and changing a preset value of each matcher.

A phenomenon analogous to damages caused during an etching process is recognized at the initial stage of forming a film by plasma CVD. At the initial stage, a film is formed on the upper portion of a pattern earlier than the lower portion. In a process of depositing an insulating film on a conductive material pattern by plasma CVD, only the upper portion of this pattern is covered with the insulating film at the initial stage of the process, and negative charges of electrons are accumulated in the upper portion. At this initial stage, ions flow excessively through the lower portion of the pattern. Therefore, at the initial deposition stage, excessive ion charges may damage a gate insulating film. For such a plasma CVD process, it is desired to reduce unbalance between positive and negative charges flowing into the substrate at the initial stage of the process.

For example, at the initial stage of a plasma CVD process, both the on/off modulation and synchronized RF bias are used, and thereafter continuous discharge is performed. In this manner, charge damages can be reduced without lowering the throughput too much. Planarization may be improved depending upon how the RF bias power source is turned on and off.

Instead of using the RF oscillator capable of being modulated, as the plasma exciting power source, an RF amplifier may be used to which a continuous RF signal or a pulse-modulated RF signal is supplied for outputting a plasma exciting power.

As above, means for modulation, synchronization, and phase control may be constituted in various ways.

In generating plasma by a μ-wave, the μ-wave is generated and on/off-modulated, and the RF bias is synchronized with this modulation. In generating plasma by light excitation, similar operations are performed.

In the above embodiments, the important point is that an electron temperature attenuates or lowers during the off-period of the plasma exciting power source. It can be considered that the attenuation characteristics of an electron temperature change with the kinds of gases. Therefore, an optimum effect can be obtained by setting a sufficient off-period depending upon the kinds of gases.

If an aspect ratio of an opening formed in an insulating film is large, the distance between a structured antenna and the upper surface of the insulating film becomes long. In this case, since even smaller charges repulse electrons, it is necessary for the prevention of damages to control an electron temperature to lower.

In the above embodiments, the thicknesses of gate insulating films are set to 6 nm and 8 nm. If a semiconductor device having an insulating film thinner than 6 nm or 8 nm is to be manufactured, the potential of a structured antenna lowers so that electrons become difficult to be attracted. Since the potential of the structured antenna rises near to the breakdown voltage of the insulating film, it can be considered that damages can be avoided if the electron temperature is controlled to be lower than the breakdown voltage, because electrons can be attracted.

In the above embodiments, an ECR plasma system and an inductive coupled plasma system are used by way of example. The principle of this invention is applicable to other systems using plasma. For example, the invention is applicable to an RIE system, a helicon wave plasma system, and other systems.

The present invention has been described in connection with the preferred embodiments. The invention is not limited only to the above embodiments. It is apparent to those skilled in the art that various modifications, improvements, combinations and the like can be made without departing from the scope of the appended claims.

We claim:

1. A method of manufacturing a semiconductor device including a transistor having an insulated gate with use of plasma wherein at least one selected from the group consisting of rf frequency, power, magnetic field, pressure, and gas species is selected so that an electron energy distribution in a plasma has an electron temperature Te expressed in electron volts which is smaller than B, where B is a breakdown voltage of the insulated gate expressed in volts, thereby allowing electrons to enter a conductive pattern appearing between insulating patterns having an aspect ratio higher than 1.

2. A method of manufacturing a semiconductor device comprising the steps of:

(a) transporting a semiconductor wafer comprising a semiconductor layer, a field insulating film and a gate insulating film formed on said semiconductor layer, said gate insulating film having a breakdown voltage of B Volts and a thickness of 10 nm or thinner, a conductive layer of a structured antenna formed on said gate insulating film and said field insulating film, said conductive layer having an antenna ratio of 500 or higher, and an insulating material pattern formed on said conductive layer, said insulating material pattern having an opening with an aspect ratio larger than 1; and (b) processing said semiconductor wafer in plasma having an electron temperature of Te expressed in electron volts, wherein Te is equal to or less than B over all areas of said semiconductor wafer.

3. A method according to claim 2, wherein said insulating material pattern is a resist pattern and said step (b) etches said conductive layer.

4. A method according to claim 2, wherein said semiconductor wafer further comprises an insulating layer between said conductive layer and said insulating material pattern, and said step (b) forms an opening in said insulating layer by etching.

5. A method according to claim 2, further comprising the step of:

(c) processing said semiconductor wafer in plasma having an electron temperature Teh expressed in electron volts higher than Te.

6. A method according to claim 5, wherein Teh is higher than B.

7. A method according to claim 5, wherein said step (c) is performed before said step (b), and said steps (b) and (c) are an etching step.

8. A method according to claim 5, wherein said step (c) is performed after said step (b), and said steps (b) and (c) are a deposition step.

9. A method according to claim 5, wherein said steps (c) and (b) are alternately performed.

10. A method of manufacturing a semiconductor device comprising the steps of:

placing a substrate in a reaction chamber, said substrate having a field insulating film, a gate insulating film and a gate wiring formed thereon;

supplying a periodically changing energy to excite plasma over said substrate; and applying a bias to said substrate synchronously with the plasma excitation, a potential of said substrate becoming substantially maximum at a time when an electron temperature of said plasma becomes substantially minimum.

11. A method according to claim 10, wherein said substantially minimum electron temperature is in the range from Temin to Temin+0.3 (Temax−Temin) where Temax is a highest electron temperature in one cycle and Temin is a lowest electron temperature in one cycle, and said substantially maximum potential of said substrate is in the range from Vsmax to Vsmax−0.1 (Vsmax−Vsmin) where Vsmax is a highest potential of said substrate in one cycle and Vsmin is a lowest potential of said substrate in one cycle.

12. A method according to claim 10, wherein parameters for excitation of said plasma are selected so as to make said substantially minimum electron temperature in the unit of eV lower than a breakdown voltage in the unit of V of said gate insulating film.

13. A method of manufacturing a semiconductor device comprising the steps of:

loading a semiconductor substrate in a reaction chamber, said semiconductor substrate having a field insulating film, a gate insulating film and a gate wiring formed thereon;

repeating a supply and a suspension of a plasma exciting main energy over said semiconductor substrate during a first period; and applying a bias potential to said semiconductor substrate synchronously with a transition timing from the suspension to the supply of said plasma exciting main energy, electrons flowing into said semiconductor substrate at said transition timing.

14. A method according to claim 13, wherein a frequency of the repetition of the supply and the suspension of said plasma exciting main energy is 5 to 500 KHz, and said plasma exciting main energy is a high frequency energy having three or more cycles during a period of the supply.

15. A method according to claim 13, wherein a frequency of the repetition of the supply and the suspension of said plasma exciting main energy is 5 to 500 KHz, and said plasma exciting main energy has a frequency five times the repetition frequency or higher.

16. A method according to claim 13, wherein a lead angle e of a phase, at which said bias potential becomes highest, from said timing is $-30° \leq \theta \leq 60°$ where one cycle of the repetition frequency of said plasma exciting main energy is represented by 360°.

17. A method according to claim 13, further comprising the step of:

generating plasma by continuously supplying said plasma exciting main energy during a second period different from said first period.

18. A method according to claim 17, wherein said second period is before said first period, and etching is performed by the plasma during said second period.

19. A method according to claim 17, wherein said second period is after said first period, and chemical vapor deposition is performed by the plasma during said second period.

20. A method according to claim 13, wherein during said first period, a plasma exciting auxiliary energy of the same type as said plasma exciting main energy is additionally and continuously applied over said semiconductor substrate.

* * * * *